United States Patent
Korbonski

(12) 
(10) Patent No.: US 6,200,392 B1
(45) Date of Patent: *Mar. 13, 2001

(54) SHEET CLEANING APPARATUS WITH CARTRIDGE ROLLER ASSEMBLY AND METHOD OF USE

(75) Inventor: John A. Korbonski, San Juan Capistrano, CA (US)

(73) Assignee: Systems Division Incorporated, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/447,616

(22) Filed: Nov. 23, 1999

Related U.S. Application Data

(63) Continuation of application No. 09/162,078, filed on Sep. 28, 1998, now Pat. No. 5,989,358, and a continuation of application No. 08/722,857, filed on Sep. 26, 1996, now Pat. No. 5,813,073.

(51) Int. Cl.[7] .................................................. B08B 1/02
(52) U.S. Cl. ................... 134/9; 15/3; 15/102; 15/256.52
(58) Field of Search ................................. 15/3, 100, 102, 15/256.52; 134/9

(56) References Cited

U.S. PATENT DOCUMENTS

| | | | | |
|---|---|---|---|---|
| 1,022,510 | * | 4/1912 | Seaborne ............................ | 15/100 |
| 1,189,633 | * | 7/1916 | Shue ................................... | 15/100 |
| 1,199,424 | * | 9/1916 | Robinson ........................... | 15/100 |
| 1,857,633 | * | 5/1932 | Gramsa .............................. | 352/130 |
| 2,791,788 | * | 5/1957 | Hausdorf ........................... | 15/100 |
| 2,983,353 | * | 5/1961 | Vilmerding ........................ | 193/45 |
| 3,053,368 | * | 9/1962 | Klahn ................................. | 193/35 R |
| 3,297,223 | * | 1/1967 | Bueker ............................... | 226/183 |
| 3,609,020 | * | 9/1971 | Kelly ................................. | 352/40 |
| 3,778,139 | * | 12/1973 | Kelly ................................ | 352/130 |
| 3,807,616 | * | 4/1974 | Hope et al. ........................ | 226/194 |
| 4,009,047 | * | 2/1977 | Lindsay ............................. | 134/9 |
| 4,018,555 | * | 4/1977 | Thettu ............................... | 15/256.52 X |

(List continued on next page.)

FOREIGN PATENT DOCUMENTS

214741 * 3/1987 (EP) .

OTHER PUBLICATIONS

Audio Technica brochure describing Audio Technica's TCN 600 range of machines.*
Teknek brochure (1pg) re "Minilab Cleaner".*
extract (12 pgs) from an Audio Technica brochure describing Audio Technica's TCN 600 range of machines, and details regarding a Teknek machine (3 pgs) said to be installed in the US on Oct. 16, 1990 (HDCM record sheet re HDCM 1500 P/2/110, Serial No. 1726 (1 pg), p. 15 entitled "Pneumatics" (1 pg), and Teknek Electronics Ltd. schematic dated Nov. 13, 1990, re CM 1500 (1 pg)).
Teknek brochure (1 pg) re "Minilab Cleaner".
Color Images said to be of Teknek 1830 machine (7 images).

*Primary Examiner*—Mark Spisich
(74) *Attorney, Agent, or Firm*—Larry K. Roberts

(57) ABSTRACT

A sheet cleaning apparatus having sets of cleaning rollers, wherein the rollers are integrated into a removable cartridge structure. Couplers are provided at roller shaft ends to connect to the roller drive. The cartridge is received in a slide carriage, permitting the cartridge to be readily removed from the apparatus by sliding the carriage out, and lifting the cartridge out from the slide carriage. With this arrangement, the down time for the sheet cleaning apparatus is minimized, since the sheet cleaning apparatus can be provided with two cartridges, and the cartridge needing maintenance can simply be quickly removed and replaced with a fresh cartridge. The production line can quickly be put back into operation, and the removed cartridge can be serviced off line for subsequent use.

35 Claims, 3 Drawing Sheets

U.S. PATENT DOCUMENTS

| | | | |
|---|---|---|---|
| 4,033,497 | * | 7/1977 | Przygocki ............................ 226/194 |
| 4,211,580 | * | 7/1980 | Vowles .................................. 134/9 |
| 4,358,194 | * | 11/1982 | Krehbiel ............................... 396/615 |
| 4,420,241 | * | 12/1983 | Kastl et al. ........................... 396/612 |
| 4,637,088 | * | 1/1987 | Badaracco et al. .................... 15/97.1 |
| 4,690,535 | * | 9/1987 | Kubata et al. ........................ 396/622 |
| 4,739,358 | * | 4/1988 | Takahashi et al. ................... 396/622 |
| 4,982,469 | * | 1/1991 | Nishiwaki .................................. 15/3 |
| 5,251,348 | * | 10/1993 | Corrado et al. ........................ 15/3 X |
| 5,349,714 | * | 9/1994 | Korbonski et al. ........................ 15/3 |
| 5,423,104 | * | 6/1995 | West ...................................... 15/100 |
| 5,425,813 | * | 6/1995 | Ernst et al. ............................ 15/3 X |

* cited by examiner

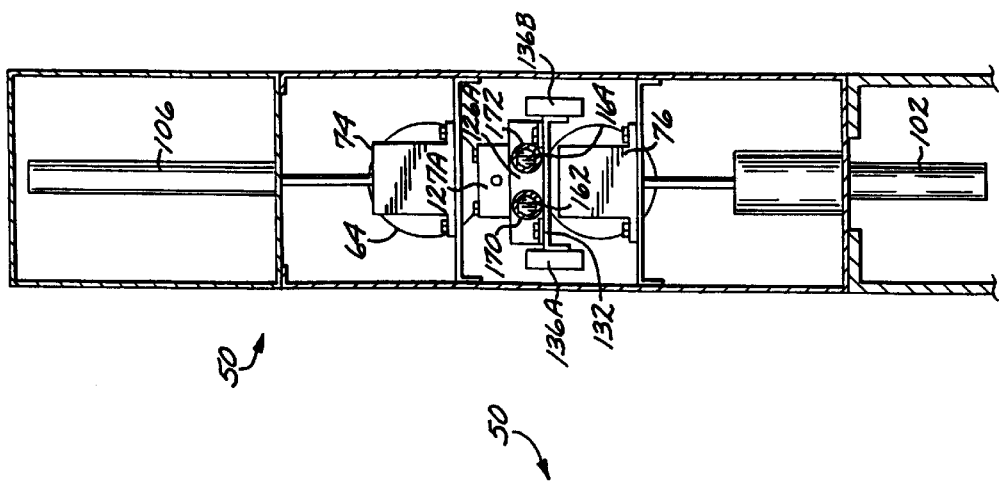
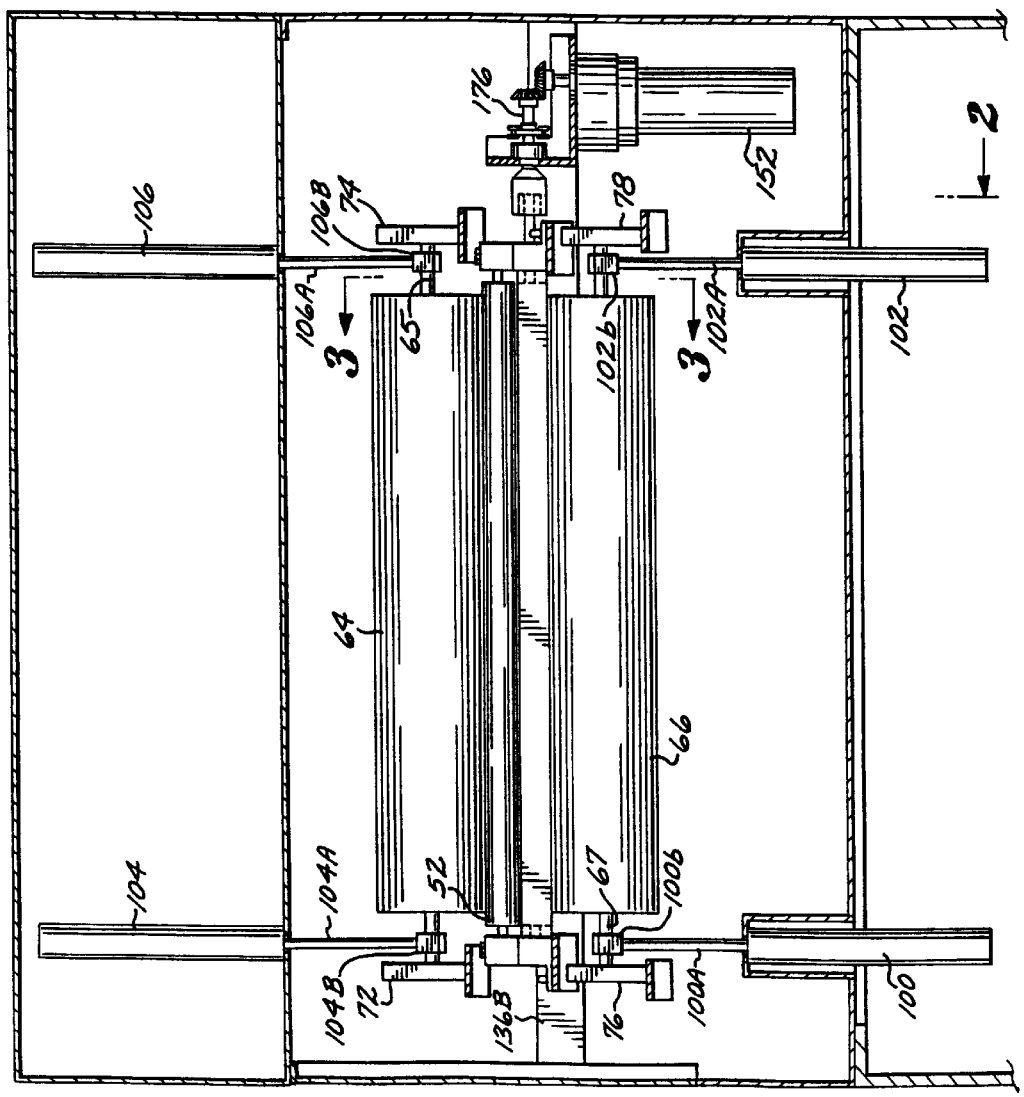

SHEET CLEANING APPARATUS WITH CARTRIDGE ROLLER ASSEMBLY AND METHOD OF USE

CROSS-REFERENCE TO RELATED APPLICATION

This is a continuation of application Ser. No. 09/162,078, filed Sep. 28, 1998, U.S. Pat. No. 5,989,358, in turn a continuation of application Ser. No. 08/722,857, filed Sep. 26, 1996, issued as U.S. Pat. No. 5,813,073.

TECHNICAL FIELD OF THE INVENTION

The present invention relates to an improved apparatus for cleaning dust and other surface particulate contaminants from material in sheet form.

BACKGROUND OF THE INVENTION

This invention is an improvement to the sheet cleaning apparatus described in U.S. Pat. No. 5,349,714, the entire contents of which are incorporated herein by reference. These apparatus are typically arranged in a printed circuit board production line, with other, very expensive machines. When the sheet cleaning apparatus needs servicing, typically to clean the sheet cleaning rollers (52, 54, 56, 58, shown e.g. in FIG. 8), the apparatus must be disassembled to remove the rollers, or the operator must clean the rollers in place. With either technique, considerable time is required for this maintenance procedure, idling not only the sheet cleaning apparatus but the other, very expensive machines on the production line.

It would therefore be advantageous to provide a sheet cleaning apparatus which can be quickly serviced to minimize the machine down time.

SUMMARY OF THE INVENTION

To overcome the foregoing problems, a sheet cleaning apparatus is described, having one or more sets of cleaning rollers, wherein the rollers are integrated into a removable cartridge assembly. Couplers are provided at roller shaft ends to connect to the roller drive. The cartridge assembly is held in a slide carriage, permitting the cartridge assembly to be readily removed from the apparatus by sliding the carriage out, and lifting the cartridge out from the slide carriage. With this arrangement, the down time for the sheet cleaning apparatus is minimized, since the sheet cleaning apparatus can be provided with two cartridges, and the cartridge needing maintenance can simply be quickly removed and replaced with a fresh cartridge. The production line can quickly be put back into operation, and the removed cartridge can be serviced off line for subsequent use.

BRIEF DESCRIPTION OF THE DRAWING

These and other features and advantages of the present invention will become more apparent from the following detailed description of an exemplary embodiment thereof, as illustrated in the accompanying drawings, in which:

FIG. 1 is a front view of a sheet cleaning apparatus embodying the invention.

FIG. 2 is a side cross-sectional view taken along line 2—2 of FIG. 1.

DETAILED DESCRIPTION OF THE PREFERRED EMBODIMENT

FIGS. 1–7 illustrate an exemplary embodiment of a sheet cleaning apparatus 50 embodying the invention. The apparatus 50 includes two pairs of sheet-contacting cleaning rollers 52, 54 and 56, 58. Rollers 52 and 54 are disposed in vertical alignment adjacent each other to define a nip 62. The surfaces of the cleaning rollers 52, 54, 56, 58 are defined by a layer of resilient compressible material which has a surface tack or adhesion sufficient to transfer dust and other foreign particulate contamination from a sheet coming into compressive contact with the roller surface. It is also desirable that the roller surfaces be smooth, in order to obtain complete contact with the surface of a sheet pressed against the surface. Typically, the roller surfaces will have a Shore A durometer value of up to 35.

Figure 3:
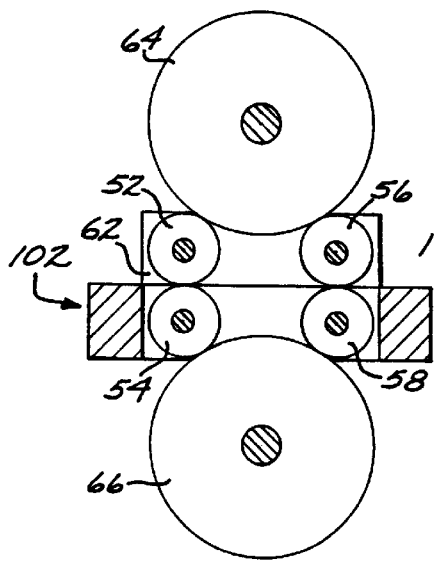
FIG. 3 is a side view illustrating the relative orientation of the sheet cleaning rollers and the roller cleaning adhesive rolls.
Figure 4:
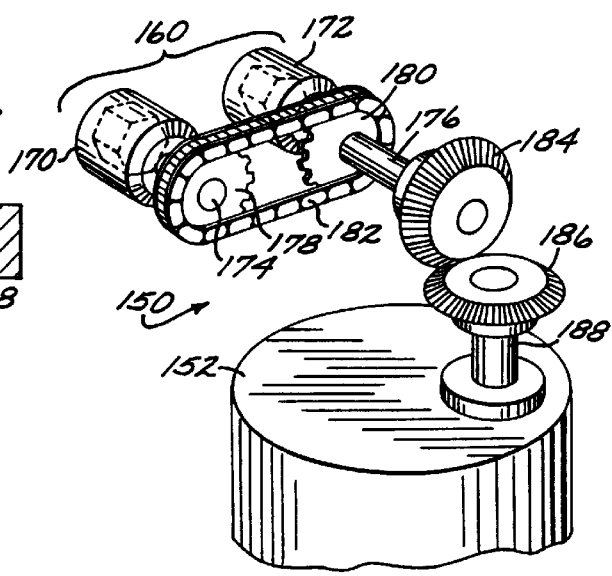
FIG. 4 is a simplified perspective view illustrating an exemplary motor/gear drive arrangement for driving the roller couplers.

In order to clean the surfaces of the sheet cleaning rollers 52–58, rolls 64, 66 of adhesive-coated tape are provided. These rolls 64, 66 are disposed so as to be in contact with respective surfaces of rollers 52-58 during sheet cleaning operations, as shown in FIG. 3. In a general sense, the rolls 64, 66 are defined by rolls of tape having the adhesive coating on the outward facing sides. The external surface of each of the rolls 64, 66 has a surface tack which greatly exceeds the surface tack of the sheet cleaning rollers 52–58, in order to transfer the foreign particles from the sheet cleaning rollers 52-58 to the surfaces of rolls 64, 66.

To the extent just described, the apparatus 50 is similar to that described in U.S. Pat. No. 5,349,714.

The apparatus 50 includes a system for applying a variable preload force, urging roller 64 into engagement with surfaces of rollers 52 and 56, and urging roller 66 into engagement with surfaces of rollers 54 and 58. The system includes pneumatic cylinders 100 and 102 which support the lower tape roller 66, and pneumatic cylinders 104 and 106 which apply pressure to the upper tape roller 64. Cylinder 100 includes a rod 100A driven by a cylinder piston to an extended position. The rod is attached to a coupler 100B which has an opening into which an end of shaft 67 carrying roll 66 is inserted. Cylinder 102 includes rod 102A driven by a cylinder piston to an extended position. Rod 102A is attached to a coupler 102B which has an opening into which the opposed end of shaft 67 is inserted. The roll 66 is therefore supported by the system comprising cylinders 100 and 102 and couplers 100B and 102B. The cylinders 100 and 102 are single acting, spring biased devices, wherein the rods are spring biased to the fully retracted position, and the rods are extended against the bias when pneumatic pressure is applied to the cylinders. Further the compression contact force of the roll 66 in relation to the sheet cleaning rollers 54 and 58 is adjustable by adjusting the pneumatic pressure applied to the cylinders 100 and 102.

The system further includes pneumatic cylinders 104 and 106 which apply pressure to the upper tape roller 64. Cylinder 104 includes a rod 104A driven by a cylinder piston to an extended position. The rod is attached to a coupler 104B which has an U-shaped opening into which a portion of shaft 65 carrying roll 64 and adjacent a shaft end is received. Cylinder 106 includes rod 106A driven by a cylinder piston to an extended position. Rod 106A is attached to a coupler 106B which has an opening into which a portion of shaft 67 adjacent the opposite end of the shaft is received. The cylinders 104 and 106 are single acting, spring biased devices, wherein the rods are spring biased to the fully retracted position, and the rods are extended against the bias when pneumatic pressure is applied to the cylinders. Further the compression contact force of the roll 64 in relation to the sheet cleaning rollers 52 and 56 is adjustable by adjusting the pneumatic pressure applied to the cylinders 104 and 106.

Figure 7:
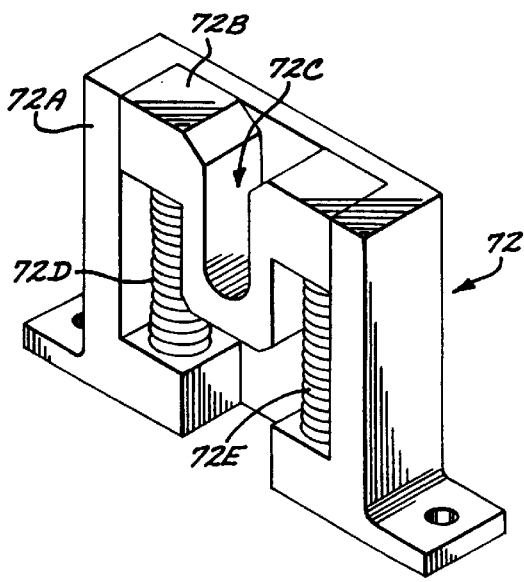
FIG. 7 is an isometric view of a roller lifting device employing in the apparatus of FIG. 1 to bias the position of the upper set of sheet cleaning rollers upwardly for separation from the lower set of sheet cleaning rollers when the apparatus is not in use.

The shaft 65 is carried by spring-loaded bracket assemblies 72 and 74. Exemplary bracket assembly 72 is illustrated in FIG. 7, and includes outer bracket fixture 72A, sliding bracket 72B which fits within the outer fixture for sliding movement, and bias spring elements 72D and 72E. The spring elements bias the relative position of the sliding bracket 72B to the upper position shown in FIG. 7, and upon application of force, the springs are compressible to permit the bracket 72B to slide down. Assembly 74 is identical to assembly 72. Together, these assemblies bias the upper tape roll 64 to an elevated position out of contact with the cleaner rollers 52, 56 when the machine is idle, i.e. when the pneumatic pressure for the cylinders 104 and 106 is released. This prevents the tape roll surface from adhering to the cleaner roller as a result of extended stationary contact. When the pneumatic pressure is removed from the cylinders 100, 102, the lower tape roll 66 drops by force of gravity out of contact with the lower set of cleaner rollers 54, 58, and is supported by a V-shaped cradle in brackets 76, 78. No spring biasing is employed in connection with brackets 76, 78, since such biasing would tend to keep the tape roll surface in contact with the surfaces of the lower cleaner rollers after the pneumatic pressure is released.

In accordance with an aspect of the invention, the cleaner rollers are arranged in an easily removable cartridge assembly 120. The assembly 120 is mounted on a slide assembly 130 which permits the cartridge assembly to be moved from a working position, with the cleaner rollers in position within the apparatus 50 for operation, and a maintenance position (shown in FIG. 5) with the cleaner rollers and the cartridge assembly slid outside the housing 50A of the cleaner apparatus 50 for ready replacement of the cartridge 120.

Figure 5:
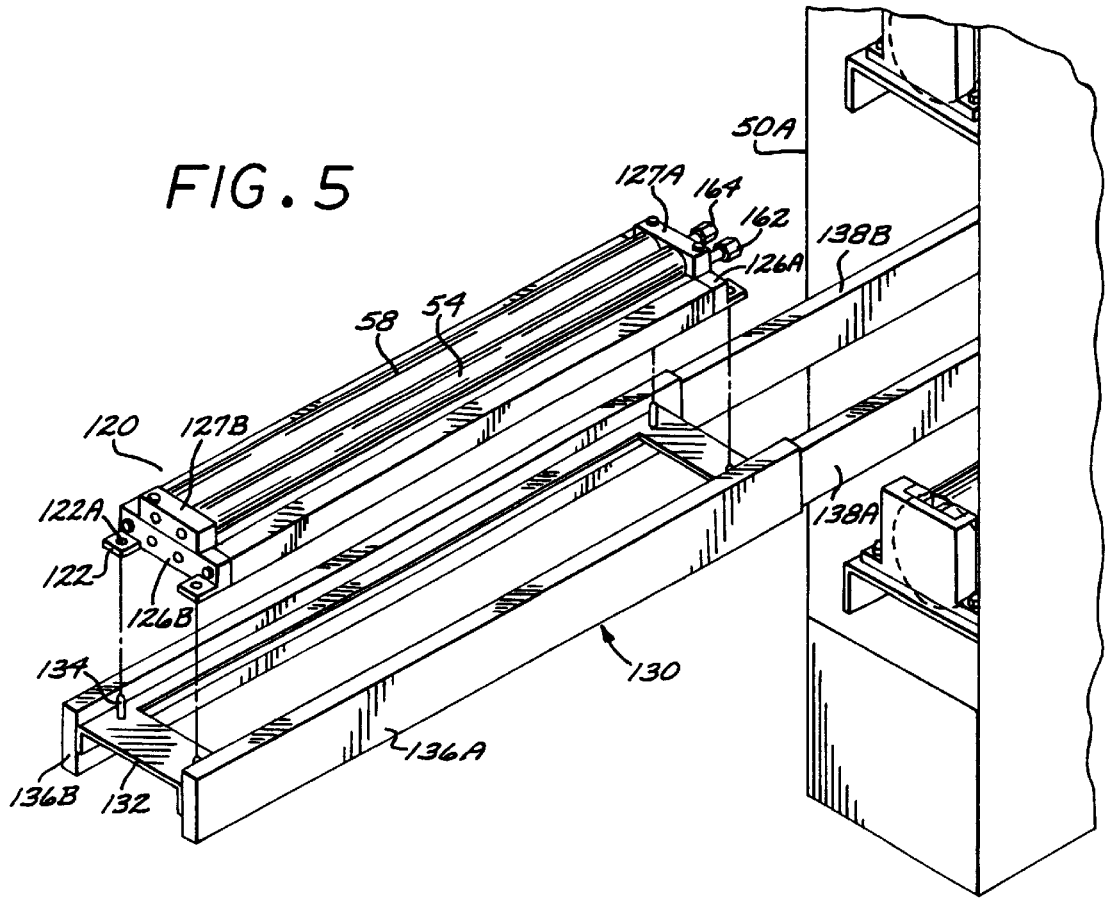
FIG. 5 illustrates the sheet cleaning apparatus with the roller cartridge exposed and removed from the cartridge slide arrangement for replacement.

As shown in FIG. 5, the slide assembly 130 includes a carriage member 132 which receives the cartridge assembly 120. Four mounting tabs 122 on the cartridge assembly have holes 122A formed therein. The cartridge assembly 120 is dropped and locked into position on the carriage 132, with pins 134 extending upwardly from the carriage 132 and received through holes 122A registering the position of the cartridge 120 on the carriage 132. The cartridge assembly is locked into position by spring-loaded locking tabs (not shown) formed with the pins 134, which locking tabs spring out after cartridge assembly has dropped onto the pins to lock the cartridge in position. This prevents the cartridge from being lifted from the carriage by the tackiness of the roll 64 as pressure is released from the pneumatic system. Other types of locking arrangements can readily be employed. The carriage 132 is mounted between a first set of opposed slide rails 136A, 136B, which in turn are mounted on a second set of opposed slide rails 138A, 138B. The second set of rails 138A, 138B are mounted on bearings (not shown) mounted to the housing 50A to permit the second set of rails to slide outwardly also. The first set of rails is mounted on bearings to permit telescoping of the first and second sets of rails. The slide rails and bearings are parts of a commercially available slide assembly, such as the three-section linear drawer slides marketed by Jonathan Company, Fullerton, Calif., which lock in both the closed and open positions.

Figure 6:
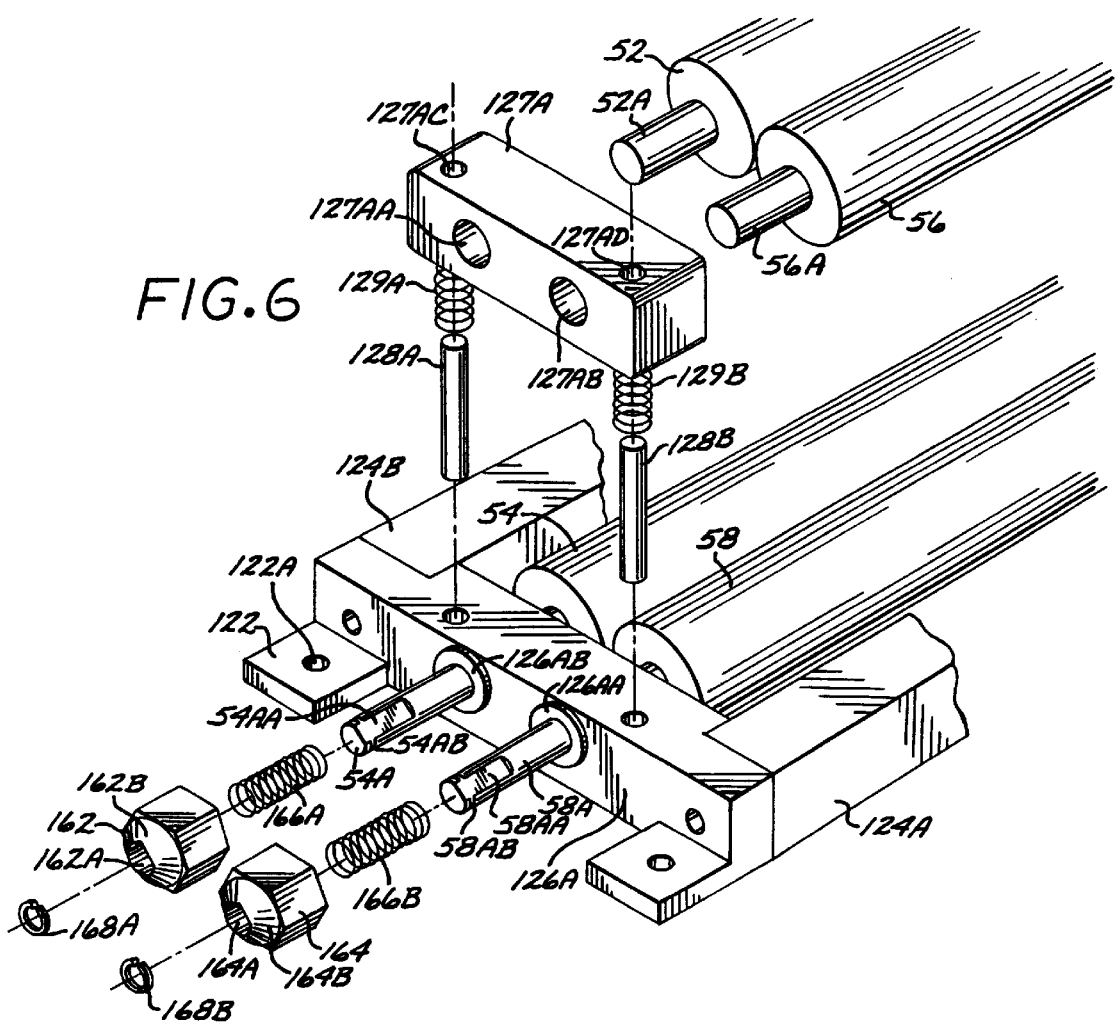
FIG. 6 is an exploded view of the drive end of the cartridge roller assembly.

The cartridge assembly 120 is shown in further detail in FIG. 6. Side rails 124A, 124B and end rails 126A, 126B form a carriage structure which carries the lower set of cleaner rollers 54, 58. The rollers rotate on respective shafts 54A, 58A which in turn are mounted on bearings fitted in openings formed in the end rails. For example, bearings 126AA and 126AB are mounted in end rail 126A. only the drive end of the cartridge assembly 120 is visible in FIG. 5. The lower set of rollers are driven by a motor drive 150 (FIGS. 1 and 4) through a drive coupler 160. The roller shafts 54A, 58A have flats 54AA, 58AA formed adjacent the shaft ends to form D-shaped shaft ends for mating with corresponding D-shaped openings 162A, 164A formed in hexagonal male coupler elements 162, 164 to prevent rotation of the coupler elements on the shafts, while permitting axial sliding movement of the coupler elements on the shafts. Springs 166A, 166B are fitted on the shafts and extend between an end surface of rail 126A and the coupler elements 162 and 164 to urge the coupler elements away from the end surface of rail 126A. Snap rings 168A, 168B lock into position in grooves 54AB and 58AB to lock the coupler elements 162, 164 onto the shafts, after assembly of the springs 166A, 166B and the coupler elements onto the shafts. The coupler elements 162, 164 are formed with conical end surfaces 162B, 164B which act as lead-in surfaces to align the male hexagonal coupler elements with corresponding female driven hexagonal coupler elements 170, 172 shown in the isolation perspective view of FIG. 4. The driven coupler elements are mounted on shafts 174, 176. Sprocket gears 178, 180 are mounted on the respective shafts 174, 176, and have an endless chain 182 mounted thereon. The shaft 176 also has a beveled gear 184 mounted thereon, which meshes with beveled gear 186 mounted on the motor shaft 188. The cleaner rollers 54, 58 are driven in the same direction by the motor drive 150.

The upper cleaner rollers 52, 56 are not actively driven. Referring again to FIG. 6, the upper rollers are mounted to the cartridge assembly 120 by upper end rails 127A, 127B. The roller shafts 52A, 56A are received in corresponding bores (e.g. 127AA, 127AB) formed in the upper end rails. The upper end rails are slidably mounted on pins 128A, 128B which are received in bores (e.g. bores 127AC, 127AD) formed in the upper end rails. Springs (e.g., springs 129A, 129B) can be fitted on the pins to provide a bias force tending to separate the upper end rails 127A, 127B from the lower end rails 126A, 126B. This in turn biases the upper set of cleaner rollers 52, 56 away from the lower set of rollers 54, 58. The upper set of pneumatic cylinders 104, 106 can exert a force on the tape roll 64 to push the upper set of rollers toward the lower set of rollers. The bias action of the springs, biasing the upper set of rollers away from the lower rollers and therefor tending to increase the nip gap, provides the advantage of facilitating the cleaning of thicker sheets for cleaning without adjusting the apparatus. For some applications, it is preferable to omit the springs fitted on the pins.

The cleaning apparatus employs a pneumatic supply and control system similar to that described in U.S. Pat. No. 5,349,714, and illustrated at FIG. 9. Similarly, the control circuit of FIG. 10 in U.S. Pat. No. 5,349,714 can be employed to control the motor drive 150. The pneumatic supply and control system and the motor drive control circuit therefore need not be described in further detail herein.

The cartridge assembly 120 can easily be replaced with a fresh cartridge. This can be done by releasing the pressure on the pneumatic cylinders 100–106, so that the tape rolls move out of engagement with the cleaner rollers 52–58. The latch of the slide assembly is then released, and the carriage 132 is pulled from the operating position to the maintenance position shown in FIG. 5. As the carriage is pulled out away from its operating position, the drive coupler elements 162, 164 become disengaged from the mating coupler elements 170, 172, thereby disconnecting the cartridge from the motor drive 150. The cartridge 120 is then removed, without the use of tools in this exemplary embodiment, by lifting the assembly up and out of engagement with the pins 134. Once the cartridge assembly 120 is removed from the carriage 132, it can quickly be replaced by a fresh cartridge with clean sets of rollers 52-58. Once a fresh cartridge is positioned in the carriage 132, the operator slides the carriage into the operating position. As the carriage slides into position, the coupler elements 162, 164 are received within the coupler elements 170, 172. There may be some initial rotational misalignment between the hexagonal mating elements. If so, the springs 166A, 166B compress as the elements 162, 164 are pushed toward the end rail 126A. The conical surfaces 162B, 164B tend to align the mating elements by acting as a lead-in surface. Even if the mating elements do not engage as the cartridge is slid into the operating position, the first time the motor drive is actuated, as the outer coupler elements 170, 172 are turned by the motor drive, the mating elements will come into alignment, and the springs 166A, 166B will urge the elements 162, 164 into an engaged aligned position relative to the outer mating elements 170, 172.

The sheet cleaning apparatus can be quickly serviced by replacement of the cartridge assembly 120, thus minimizing the machine down time. The removed cartridge assembly 120 can be serviced off line. The upper set of rollers 52, 56 can easily be removed from the cartridge assembly for cleaning, and to expose the lower set of rollers for cleaning.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. A sheet cleaning apparatus for cleaning foreign particles from at least one surface of a sheet, comprising:
    a frame;
    a sheet cleaning roller cartridge assembly including at least one sheet cleaning roller rotatably secured thereto for rotation about a sheet cleaning roller axis, said roller defining a peripheral roller surface;
    a roller cleaning member having a contact surface, said contact surface adapted to transfer foreign particles from said peripheral surface of said cleaning roller to said contact surface of said roller cleaning member during sheet cleaning operations, said roller cleaning member having an external surface defining said contact surface and a cleaning element axis arranged substantially parallel to said roller axis; and
    mounting apparatus for mounting said roller cartridge assembly in relation to said frame, said mounting apparatus is adapted to permit movement of said roller cartridge assembly between an operating position in an apparatus operating mode wherein the sheet cleaning roller is in position for sheet cleaning operation and a maintenance position during an apparatus maintenance mode wherein said cartridge assembly is accessible for servicing.

2. The apparatus of claim 1 wherein said mounting apparatus includes a cartridge carriage and a slide apparatus to which said carriage is mounted, said slide apparatus adapted to permit sliding movement of said cartridge carriage along a slide axis between said operating position and said maintenance position.

3. The apparatus of claim 1 further comprising a drive apparatus for applying a rotational drive to said sheet cleaning roller.

4. The apparatus of claim 3 wherein said drive apparatus includes an electric motor for providing a source of rotational energy.

5. A sheet cleaning apparatus for cleaning foreign particles from first and second opposed surfaces of a sheet, comprising:
    a frame;
    a sheet cleaning roller cartridge assembly including a first pair of sheet cleaning rollers, said first pair comprising first and second sheet cleaning rollers rotatably mounted for rotation about first and second sheet cleaning roller axes, each roller defining a peripheral roller surface, said first and second rollers disposed adjacent each other with said axes disposed in parallel to receive therebetween a sheet having said surfaces to be cleaned;
    first and second roller cleaning members respectively disposed adjacent said first and second sheet cleaning rollers, each sheet cleaning member having a contact surface, said contact surface adapted to transfer foreign particles from said peripheral surface of said cleaning roller to said contact surface of said roller cleaning member, said roller cleaning member having an external surface defining said contact surface and a cleaning element axis arranged substantially parallel to said respective roller axes;
    mounting apparatus for mounting said roller cartridge assembly in relation to said frame, said mounting apparatus comprising a slide apparatus permitting movement of said roller cartridge assembly between an operating position in an apparatus operating mode wherein each sheet cleaning roller is in position for sheet cleaning operation and a maintenance position during an apparatus maintenance mode wherein said cartridge assembly is accessible for servicing.

6. The apparatus of claim 5 wherein said mounting apparatus includes a cartridge carriage carried by said slide apparatus.

7. The apparatus of claim 6 wherein said carriage includes cartridge position registration elements for registering said cartridge in a cartridge position on said carriage.

8. The apparatus of claim 5 further comprising a drive apparatus for applying a rotational drive to said first sheet cleaning roller.

9. The apparatus of claim 8 wherein said drive apparatus includes an electric motor for providing a source of rotational energy.

10. The apparatus of claim 5, wherein said cartridge assembly further includes a second pair of sheet cleaning rollers, said second pair comprising third and fourth sheet cleaning rollers rotatably mounted for rotation about third and fourth sheet cleaning roller axes, each roller of said second pair defining a peripheral roller surface adapted to transfer foreign particles from said sheet to said peripheral roller surface upon contact and subsequent separation therebetween, said third and fourth rollers disposed adjacent each other with said axes disposed in parallel to receive therebetween a sheet having said surfaces to be cleaned, said first pair disposed adjacent said second pair.

11. The apparatus of claim 5, wherein said cartridge assembly further comprises biasing apparatus for biasing the first and second sheet cleaning rollers apart in the absence of a loading force.

12. The apparatus of claim 11 wherein said biasing apparatus includes a pair of spring members arranged at respective ends of roller support end rails.

13. A sheet cleaning apparatus for cleaning foreign particles from at least one surface of a sheet, comprising:
   a frame;
   first and second sheet cleaning roller assemblies, each said assembly including at least one sheet cleaning roller rotatably secured thereto for rotation about a sheet cleaning roller axis, said roller defining a peripheral roller surface adapted to transfer foreign particles from said sheet to said peripheral roller surface upon contact and subsequent separation therebetween while affording clean separation between the sheet and said peripheral surface;
   a roller cleaning member associated with one of said roller assemblies having a contact surface adapted to transfer foreign particles from said peripheral surface of said cleaning roller to said contact surface of said roller cleaning member during sheet cleaning operations, said roller cleaning member having an external surface defining said contact surface and a cleaning element axis arranged substantially parallel to said roller axis;
   mounting apparatus for mounting said first and second roller assemblies in relation to said frame, said mounting apparatus permitting movement of the roller assemblies from an operating position to a service position.

14. A method for cleaning foreign particles from at least one surface of a sheet, comprising the following steps:
   providing a cleaning apparatus including a removable sheet cleaning roller cartridge assembly including at least one sheet cleaning roller rotatably secured thereto for rotation about a sheet cleaning roller axis, said roller defining a peripheral roller surface, and a roller cleaning member having a contact surface adapted to transfer foreign particles from said peripheral surface of cleaning roller to said contact surface of said roller cleaning member during sheet cleaning operations, said roller cleaning member having an external surface defining said contact surface and a cleaning element axis arranged substantially parallel to said roller axis;
   mounting said roller cartridge assembly in relation to an apparatus frame so as to permit movement of said roller cartridge assembly with respect to the frame from an operating position to a service position;
   passing one or more sheets to be cleaned through the cleaning apparatus during an operating mode;
   moving said sheet cleaning roller cartridge assembly from said operating position to said service position during a maintenance mode.

15. The method of claim 14 wherein the mounting step includes:
   mounting the sheet cleaning roller cartridge assembly on a slide assembly which supports the cartridge assembly for sliding movement between the operating position and the service position along a slide axis parallel to the roller axis, and wherein the cartridge assembly is supported by the slide assembly at the service position.

16. The method of claim 15 further comprising the step of:
   with the sheet cleaning roller cartridge assembly in said service position, lifting the at least one sheet cleaning roller out from the slide assembly in a direction transverse to the slide axis.

17. The method of claim 15 further comprising:
   after positioning the sheet cleaning roller cartridge assembly in said service position, removing the sheet cleaning roller cartridge assembly from the slide assembly by lifting the roller cartridge assembly out from the slide assembly in a direction transverse to the slide axis.

18. The method of claim 15 further comprising:
   after positioning the sheet cleaning roller cartridge assembly in said service position, removing the sheet cleaning roller cartridge assembly from the slide assembly;
   providing a fresh sheet cleaning roller cartridge assembly;
   mounting the fresh sheet cleaning roller cartridge assembly in the slide assembly;
   moving the fresh sheet cleaning roller cartridge assembly to the operating position.

19. The method of claim 18 wherein each of the steps of mounting the roller cartridge assembly, moving the roller cartridge assembly from the operating position to the service position, removing the roller cartridge assembly from the slide assembly and mounting the fresh sheet cleaning roller cartridge assembly in the slide assembly are performed without the use of tools.

20. The method of claim 15 wherein the step of moving the cartridge roller assembly from the service position to the operating position engages the cartridge roller assembly with a drive apparatus for rotating the at least one sheet cleaning roller, said engaging occurring automatically as the cartridge roller assembly is moved to the operating position.

21. The method of claim 20 wherein the step of moving the cartridge roller assembly from the operating position to the service position automatically disengages the cartridge roller assembly from the drive apparatus, wherein access to the drive apparatus is not required to move the cartridge roller assembly from the service position to the operating position.

22. The method of claim 21 wherein the drive apparatus engages a first end of the roller cartridge assembly in the operating position, and wherein the roller cartridge assembly slides away from the drive apparatus when the roller cartridge assembly is moved from the operating position to the service position.

23. A sheet cleaning apparatus for cleaning at least one surface of a sheet, comprising:
   at least one set of sheet cleaning rollers for contacting said at least one surface of the sheet during a sheet cleaning mode, wherein the rollers are integrated into a removable cartridge assembly, the rollers having opposed first and second shaft ends;
   a drive apparatus for applying a rotational drive to said at least one set of sheet cleaning rollers;
   a coupler apparatus for-coupling the drive apparatus to said at least one set of sheet cleaning rollers when the cartridge assembly is in an operating position;
   a slide assembly for mounting the at least one set of sheet cleaning rollers, the assembly permitting sliding movement of the at least one set of cleaning rollers along a slide axis extending parallel to a sheet cleaning roller axis between the operating position and a maintenance position, with the slide assembly supporting the at least one set of sheet cleaning rollers at the maintenance position, the slide assembly permitting the cartridge assembly to be readily removed from the sheet cleaning apparatus by sliding a slide carriage of said slide assembly out to move the at least one set of sheet cleaning rollers from the operating position to the maintenance position, and lifting the sheet cleaning rollers out from the slide carriage in a direction transverse to the slide axis.

24. The apparatus of claim 23, further comprising a second cartridge comprising a replacement set of sheet cleaning rollers, whereby the at least one set of sheet cleaning rollers integrated into the cartridge can be quickly removed from the slide assembly and replaced with the replacement cartridge.

25. The apparatus of claim 23, wherein the at least one set of sheet cleaning rollers includes:

a first set of sheet cleaning rollers driven by the drive apparatus, the first set comprising first and second sheet cleaning rollers; and a second set of sheet cleaning rollers, the second set comprising third and fourth sheet cleaning rollers which are not directly coupled to the drive apparatus.

26. The apparatus of claim 25, wherein said slide assembly carriage supports the first set of sheet cleaning rollers in a lower position, with the second set of sheet cleaning rollers in an upper position with respect to the lower position, said third and fourth rollers are adapted to be removed from said upper position while the first and second rollers remain in said lower position held on said carriage.

27. The apparatus of claim 23 wherein said coupler apparatus and said slide assembly are adapted to permit said cartridge assembly to be moved from its operating position to said maintenance position and said sheet cleaning rollers removed from the slide assembly without the use of tools.

28. A sheet cleaning apparatus for cleaning at least one surface of a sheet, comprising:

a frame;

at least one set of sheet cleaning rollers for contacting said at least one surface of the sheet during a sheet cleaning mode, the rollers having opposed first and second shaft ends;

a drive apparatus mounted in the frame for applying a rotational drive to said at least one set of sheet cleaning rollers;

a coupler apparatus for coupling the drive apparatus to said at least one set of sheet cleaning rollers when the cartridge assembly is in an operating position;

a slide assembly mounted in the frame for mounting the at least one set of sheet cleaning rollers, the assembly permitting sliding movement of the at least one set of cleaning rollers along a slide axis extending parallel to a sheet cleaning roller axis between the operating position and a maintenance position, with the slide assembly and frame supporting the at least one set of sheet cleaning rollers at the maintenance position to permit servicing of the at least one set of sheet cleaning rollers.

29. The apparatus of claim 28, wherein the at least one set of sheet cleaning rollers are integrated into a cartridge assembly including cartridge end rails, the end rails engaging the slide assembly, the slide assembly permitting the cartridge assembly to be readily removed from the sheet cleaning apparatus by sliding a slide carriage of said slide assembly out to move the at least one set of sheet cleaning rollers from the operating position to the maintenance position, and lifting the sheet cleaning rollers out from the slide carriage in a direction transverse to the slide axis.

30. The apparatus of claim 29, wherein the cartridge assembly further includes side rails which connect to the cartridge end rails.

31. The apparatus of claim 29, further comprising a second cartridge comprising a replacement set of sheet cleaning rollers, whereby the at least one set of sheet cleaning rollers integrated into the cartridge can be quickly removed from the slide assembly and replaced with the replacement cartridge.

32. The apparatus of claim 28, wherein the at least one set of sheet cleaning rollers includes:

a first set of sheet cleaning rollers driven by the drive apparatus, the first set comprising first and second sheet cleaning rollers; and a second set of sheet cleaning rollers, the second set comprising third and fourth sheet cleaning rollers which are not directly coupled to the drive apparatus.

33. The apparatus of claim 32, wherein said slide assembly includes a carriage structure which holds the first set of sheet cleaning rollers in a lower position, with the second set of sheet cleaning rollers in an upper position with respect to the lower position, said third and fourth rollers are adapted to be removed from said upper position while the first and second rollers remain in said lower position held on said carriage structure.

34. The apparatus of claim 28 wherein said coupler apparatus and said slide assembly are adapted to permit said at least one set of sheet cleaning rollers to be moved from its operating position to said maintenance position and said sheet cleaning rollers removed from the slide assembly without the use of tools.

35. The apparatus of claim 28 further including position registration elements for registering the position of the at least one set of sheet cleaning rollers in a predetermined position on the slide assembly, and a locking apparatus preventing undesired lifting of the at least one set of sheet cleaning rollers from the slide apparatus in a direction transverse to the slide axis during sheet cleaning operations.

* * * * *